US008989232B2

(12) United States Patent
Khajavikhan et al.

(10) Patent No.: US 8,989,232 B2
(45) Date of Patent: Mar. 24, 2015

(54) NANOSCALE COAXIAL LASERS

(71) Applicant: The Regents of the University of California, Oakland, CA (US)

(72) Inventors: Mercedeh Khajavikhan, Orlando, FL (US); Yeshaiahu Fainman, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/975,205

(22) Filed: Aug. 23, 2013

(65) Prior Publication Data
US 2014/0054475 A1    Feb. 27, 2014

Related U.S. Application Data

(60) Provisional application No. 61/692,682, filed on Aug. 23, 2012.

(51) Int. Cl.
*H01S 3/091* (2006.01)
*H01S 5/30* (2006.01)
*G01J 1/42* (2006.01)
(Continued)

(52) U.S. Cl.
CPC ... *H01S 5/30* (2013.01); *G01J 1/42* (2013.01); *H01S 5/1042* (2013.01); *H01S 5/1046* (2013.01); *H01S 5/041* (2013.01);
(Continued)

(58) Field of Classification Search
CPC ........................................................ H01S 5/30
USPC ............................................................ 372/70
See application file for complete search history.

(56) References Cited

U.S. PATENT DOCUMENTS 3,681,690 A    8/1972    Mary
4,576,447 A    3/1986    Korsch
(Continued)

FOREIGN PATENT DOCUMENTS

WO    WO-2008/039212 A2    4/2008

OTHER PUBLICATIONS

Altewischer, et al., "Polarization analysis of propagating surface plasmons in a subwavelength hole array," *Journal of the Optical Society of America B*, 20(9):1927-1931, Sep. 2003.
(Continued)

*Primary Examiner* — Xinning Niu
*Assistant Examiner* — Vu A Vu
(74) *Attorney, Agent, or Firm* — Perkins Coie LLP

(57) ABSTRACT

Methods, structures, devices and systems are disclosed for implementing compact (e.g., nanoscale) coaxial lasers with coaxial cavity geometries which can be used to construct various coaxial cavity lasers that can operate in single mode, at room-temperature, and produce continuous-wave lasing. The described laser systems can also operate at low-temperatures, and provide thresholdless lasing using a spectrally broadband semiconductor gain medium. The cavity of the compact lasers includes a central metal core and a hollow ring surrounding the central metal core, formed within a housing with an open terminal and a closed terminal. The open terminal is positioned to both receive pump light and output laser light, and the closed terminal includes a metal cap that encloses the central metal rod and one side of the hollow ring. The described nano cavities also include a ring-shaped gain medium section, and ring-shaped lower and upper plug sections.

30 Claims, 9 Drawing Sheets

(51) Int. Cl.
*H01S 5/10* (2006.01)
*H01S 5/04* (2006.01)
*H01S 5/343* (2006.01)
*H01S 5/40* (2006.01)

(52) U.S. Cl.
CPC .......... *H01S 5/1071* (2013.01); *H01S 5/34306* (2013.01); *H01S 5/4025* (2013.01); *H01S 2301/166* (2013.01)
USPC ........................................................ 372/70

(56) References Cited

U.S. PATENT DOCUMENTS

| | | |
|---|---|---|
| 5,229,833 A | 7/1993 | Stewart |
| 5,255,075 A | 10/1993 | Cush |
| 5,757,557 A | 5/1998 | Medvedev et al. |
| 5,793,538 A | 8/1998 | Cameron et al. |
| 5,846,843 A | 12/1998 | Simon |
| 5,952,035 A | 9/1999 | Erb et al. |
| 6,169,637 B1 | 1/2001 | Tsunashima |
| 6,331,276 B1 | 12/2001 | Takei et al. |
| 6,462,809 B1 | 10/2002 | Ryan et al. |
| 6,818,907 B2 | 11/2004 | Stark |
| 6,859,334 B1 | 2/2005 | Kuiseko et al. |
| 6,930,057 B2 | 8/2005 | Saito et al. |
| 8,005,125 B2 * | 8/2011 | Yang ........................... 372/50.11 |
| 2001/0040130 A1 | 11/2001 | Lorch et al. |
| 2002/0001146 A1 | 1/2002 | Nanba |
| 2003/0087290 A1 | 5/2003 | Tarlov et al. |
| 2003/0132392 A1 | 7/2003 | Kuroda et al. |
| 2004/0130723 A1 | 7/2004 | Yager et al. |
| 2004/0183176 A1 | 9/2004 | Naya et al. |
| 2004/0218249 A1 | 11/2004 | Kochergin |
| 2005/0105091 A1 | 5/2005 | Lieberman et al. |
| 2006/0034729 A1 | 2/2006 | Poponin |
| 2006/0072114 A1 | 4/2006 | Sigalas et al. |
| 2008/0278728 A1 | 11/2008 | Tetz et al. |
| 2011/0188525 A1 * | 8/2011 | Claudon et al. ................. 372/34 |
| 2012/0105853 A1 | 5/2012 | Pang et al. |

OTHER PUBLICATIONS

Baida, et al., "Subwavelength metallic coaxial waveguides in the optical range: Role of the plasmonic modes," *Physical Review B*, 74:205419, Nov. 2006.
Barnes, et al., "Photonic surfaces for surface-plasmon polaritons," *Journal of the Optical Society of America A*, 14(7):1654-1661 Jul. 1997.
Barnes, et al., "Physical origin of photonic energy gaps in the propagation of surface plasmons on gratings," *Physical Review B*, 54(9):6227-6244, Sep. 1996.
Barnes, et al., "Surface Plasmon Polaritons and Their Role in the Enhanced Transmission of Light Through Periodic Arrays of Subwavelength Holes in a Metal Film," *Physical Review Letters*, 92(10):107401(1-4), Mar. 2004.
Barnes, et al., "Surface plasmon subwavelength optics," *Nature*, 424:824-830, Aug. 2003.
Brolo, et al., "Surface Plasmon Sensor Based on the Enhanced Light Transmission through Arrays of Nanoholes in Gold Films," *Langmuir*, 20(12):4813-4815, May 2004.
Bryan-Brown, et al., "Polarisation conversion through the excitation of surface plasmons on a metallic grating," *Journal of Modern Optics*, 37(7):1227-1232, Jul. 1990.
Cao, et al., "Negative Role of Surface Plasmons in the Transmission of Metallic Gratings with Very Narrow Slits," *Phyiscal Review Letters*, 88(5):057403(1-4), Feb. 2002.
Cathey, et al., "New Paradigm for Imaging Systems," Applied Optics, vol. 41, No. 29, pp. 6080-6093, 2002.
Chen, H.M., et al., "Three-dimensional composite metallodielectric nanostructure for enhanced surface plasmon resonance sensing," *Applied Physics Letters*, 94(7):073117(1-3), Feb. 2009.

Chen, X., et al., "Multi-level multi-thermal-electron FDTD simulation of plasmonic interaction with semiconducting gain media: applications to plasmonic amplifiers and nano-lasers," *Optics Express*, 18(16):17220-17238, Aug. 2010.
Ditlbacher, et al., "Two-dimensional optics with surface plasmon polaritons," *Applied Physics Letters*, 81(10):1762-1764, Sep. 2002.
Draganov, et al., "Compact Telescope for Free Space Communications,", Proc. of SPIE vol. 4767, pp. 151-158, 2002.
Dykhne, et al., "Resonant transmittance through metal films with fabricated and light-induced modulation," *Physical Review B*, 67(19):195402(1-13), May 2003.
Ebbesen, et al., "Extraordinary optical transmission through subwavelength hole array," *Nature*, 391:667-669, Feb. 1998.
Eftekhari, et al., "Nanoholes as Nanochannels: Flow-through Plasmonic Sensing," *Analytical Chemistry*, 81(11):4308-4311, Jun. 2009.
Fano, "Effects of Configuration Interaction on Intensities and Phase Shifts," *Physical Review*, 124(6):1866-1878, Dec. 1961.
Feigenbaum, et al, "Ultrasmall Volume Plasmons, yet with Complete Retardation Effects," *Physical Review Letters*, 101(16):163902, Oct. 2008.
Genet, et al., "Fano-type interpretation of red shifts and red tails in hole array transmission spectra," *Optics Communications*, 225(4-6):331-336, Oct. 2003.
Ghaemi, et al., "Surface plasmons enhance optical transmission through subwavelength holes," *Physical Review B*, 58(11):6779-6782, Sep. 1998.
Gordon, et al., Strong Polarization in the Optical Transmission through Elliptical Nanohole Arrays, *Physical Review Letters*, 92(3):037401(1-4), Jan. 2004.
Goto, et al., "Propagation loss measurement for surface plasmon-polariton modes at metal waveguides on semiconductor substrates," *Applied Physics Letters*, 84(6):852-854, Feb. 2004.
Hensley, et al., "Analytical biotechnology," *Current Opinion in Biotechnology*, 8(1):1-5, Feb. 1997.
Hill, et al, "Lasing in metallic-coated nanocavities," *Nature Photonics*, 1:589-594, 2007.
Homola, et al., "Surface plasmon resonance sensors based on diffraction grating and prism couplers: sensitivity comparison," *Sensors and Actuators B: Chemical*, 54(1-2):16-24, Jan. 1999.
Homola, et al., "Surface plasmon resonance sensors: review," *Sensors and Actuators B: Chemical*, 54(1-2):3-15, Jan. 1999.
Im, et al., Vertically Oriented Sub-10-nm Plasmonic Nanogap Arrays, *Nano Letters*, 10(6):2231-2236, May 2010.
Khajavikhan, et al., "Thresholdless Nanoscale Coaxial Lasers," *Nature*, 482:204-207, Feb. 2012.
Kim, et al, "The metal-clad semiconductor nanoring laser and its scaling properties," *Opt. Express*,19:3218-3225, 2011.
Kwon, et al., "Subwavelength Plasmonic Lasing from a Semiconductor Nanodisk with Silver Nanopan Cavity," *Nano Lett.*, 10(9), 2010).
Laikin, M., "Catadioptric and Mirror Optical Systems," *Lens Design*, Chapter 15, pp. 181-201, 2005.
Lamprecht, et al., "Surface plasmon propagation in microscale metal stripes," *Applied Physics Letters*, 79(1):51-53, Jul. 2001.
Lezec, et al., "Beaming Light from a Subwavelength Aperturen," *Science*, 297(5582):820-822, Aug. 2002.
Mahajan, V.N., "Imaging With Obscured Pupils," Optics Letters, vol. 1, No. 4, pp. 128-129, 1977.
Maier, et al., "Plasmonics—A Route to Nanoscale Optical Devices," *Advanced Materials*, 13(19):1501-1505, Oct. 2001.
Martin-Moreno, et al., "Theory of Extraordinary Optical Transmission through Subwavelength Hole Arrays," *Physical Review Letters*, 86(6):1114-1117, Feb. 2001.
McCall, et al., "Whispering gallery mode microdisk lasers," *Appl. Phys. Lett.*, 60:289-291, 1992.
Mizrahi, et al., "Low threshold gain metal coated laser Nanoresonators," Opt. Lett., 33(11):1261-1263, 2008.
Nezhad, et al., "Gain assisted propagation of surface plasmon polaritons on planar metallic waveguides," *Optics Express*, 12(17):4072-4079, Aug. 2004.
Nezhad, et al., "Room-temperature subwavelength metallo-dielectric lasers," *Nat. Photon.*, 4:395-399, 2010.

(56) References Cited

OTHER PUBLICATIONS

Noginov, et al., "Demonstration of a spaser-based nanolaser," *Nature*, 460:1110-1112, 2009.
Painter, et al., "Two-Dimensional Photonic Band-Gap Defect Mode Laser," *Science*, 284 (5421):1819-1821, 1999.
Pang, et al., "Controlled detection in composite nanoresonant array for surface plasmon resonance sensing," *Optics Express*, 17(17):14700-14709, Aug. 2009.
Pang, et al., "Spectral sensitivity of two-dimensional nanohole array surface plasmon polariton resonance sensor," *Applied Physics Letters*, 91(12):123112(1-3), Sep. 2007.
Rokitski, et al., "Propagation of Femtosecond Surface Plasmon Polariton Pulses on the Surface of a Nanostructured Metallic Film: Space-Time Complex Amplitude Characterization," *Physical Review Letters*, 95(17):177401(1-4), Oct. 2005.
Rokitski, et al., "Study of spatial-temporal characteristics of optical fiber based on ultrashort-pulse interferometry," *Optics Letters*, 26(15):1125-1127, Aug. 2001.
Sarrazin, et al., "Role of Wood anomalies in optical properties of thin metallic films with a bidimensional array of subwavelength holes," *Physical Review B*, 67(8):085415(1-8), Feb. 2003.
Steele, et al., "Metallodielectric grating with subwavelength slots: Optical properties," *Physical Review B*, 68(20):205103(1-7), Nov. 2003.
Tetz, et al., "Characterization of surface plasmon polariton pulse propagation on thin metallic films and two dimensional nanohole arrays," *The 18th Annual Meeting of the IEEE Lasers and Electro-Optics Society (LEOS)*, pp. 158-159, Oct. 2005.
Tetz, et al., "Excitation and Direct Imaging of Surface Plasmon Polariton Modes in Near-Infrared," *The 17th Annual Meeting of the IEEE Lasers and Electro-Optics Society (LEOS)*, vol. 2, pp. 947-948, Nov. 2004.
Tetz, et al., "Excitation and direct imaging of surface plasmon polariton modes in a two-dimensional grating," *Applied Physics Letters*, 86(11):111110(1-3), Mar. 2005.
Tetz, et al., "High-resolution surface plasmon resonance sensor based on linewidth-optimzed nanohole array transmittance," *Optics Letters*, 31(10):1528-1530, May 2006.
Tremblay, et al., "Ultra-Thin Folded Imager," Technical Digest, paper CMB2, Optical Society of America, 2005.
Tremblay, et al., "Ultrathin Four-Reflection Imager," Applied Optics, vol. 48, No. 2, pp. 343-354, Jan. 10, 2009.
Tremblay, et al., "Relaxing The Alignment And Fabrication Tolerances Of Thin Annular Folded Imaging Systems Using Wavefront Coding," Applied Optics, vol. 46, No. 27, pp. 6751-6758, Sep. 20, 2007.
Tremblay, et al., "Ultrathin Cameras Using Annular Folded Optics," Applied Optics, vol. 46, No. 4, pp. 463-471, Feb. 1, 2007.
Yanik, et al., "Integrated nanoplasmonic-nanofluidic biosensors with targeted delivery of analytes," *Applied Physics Letters*, 96(2):021101(1-3), Jan. 2010.
Yu, et al., "Subwavelength metal-optic semiconductor nanopatch lasers," *Opt. Express*, 18:8790-8799, 2010.
Zayats, et al., "Near-field photonics: surface plasmon polaritons and localized surface plasmons," *Journal of Optics A: Pure and Applied Optics*, 5(4):S16-S50, Jul. 2003.
Zhu, et al., "Protein chip technology," *Current Opinion in Chemical Biology*, 7(1):55-63, Feb. 2003.

\* cited by examiner

NANOSCALE COAXIAL LASERS

PRIORITY CLAIM AND RELATED APPLICATION

The application claims priority to U.S. Provisional Patent Application No. 61/692,682 entitled "THRESHOLDLESS NANOSCALE COAXIAL LASERS" and filed on Aug. 23, 2012, the contents of which are herein incorporated by reference for all purposes.

STATEMENT REGARDING FEDERALLY SPONSORED RESEARCH OR DEVELOPMENT

This invention was made with government support under grant ECCS-1063976 awarded by the National Science Foundation and grant W911NF-07-1-0338 awarded by the United States Army. The government has certain rights in the invention.

TECHNICAL FIELD

The present application generally relates to field of lasers and more specifically to lasers having coaxial cavities.

BACKGROUND

A laser is a device that emits light (electromagnetic radiation) with a high degree of spatial and temporal coherence through a process of optical amplification based on the stimulated emission of photons. The term laser is an acronym for Light Amplification by Stimulated Emission of Radiation.

Components of a laser include an energy supply, a gain medium to amplify light by stimulated emission, and an optical feedback mechanism. A laser generates or amplifies light of a specific wavelengths or a range of wavelengths through the gain medium by converting electrical or optical pump energy into the energy of the coherent laser output. An optical cavity can serve as the optical feedback mechanism. For example, light can be directed back and forth between the two ends of the cavity that act as mirrors, passing through the gain medium while being amplified each time. In some laser designs, one end of the optical cavity (the output coupler) is partially transparent to allow light within specific range of wavelength to escape through.

SUMMARY

The disclosed embodiments relate to methods, devices and systems for producing compact solid state lasers with coaxial cavity geometries. The described lasers can operate in a continuous wave (CW) mode at room-temperature, or at lower temperatures, and produce thresholdless lasing using a spectrally broadband gain medium. Such a thresholdless lasing occurs when all of the photons emitted by the gain medium are funneled into the lasing mode.

One aspect of the disclosed embodiments relates to a laser based a coaxial cavity that includes a metal housing including a central metal core and a hollow ring surrounding the central metal core. The metal housing includes an open terminal and a closed terminal. The open terminal configured to receive pump light for optically pumping a laser gain medium and for outputting laser light generated by the laser gain medium, and the closed terminal included a metal cap that encloses the central metal rod and one side of the hollow ring. The laser gain medium in such a laser is filled in the hollow ring inside the metal housing, and absorbs pump light and produces an optical gain at a laser wavelength. The laser also includes a first low index material with a refractive index lower than a refractive index of the laser gain medium. The first low index material is filled in the hollow ring between the metal cap and the laser gain medium to form a first interface with the laser gain medium. The laser further includes a second low index material with a refractive index lower than the refractive index of the laser gain medium. The second low index material is filled in the hollow ring between open terminal and the laser gain medium to form a second interface with the laser gain medium.

In one exemplary embodiment, the laser gain medium, the metal housing and the first low index material are dimensioned to produce the output laser light with only a single transverse mode. In another exemplary embodiment, the laser gain medium is a broadband gain medium. For example, the laser gain medium can have a bandwidth that approximately spans 1.26 microns to 1.59 microns. In yet another exemplary embodiment, the laser gain medium comprises a series of quantum well structures. In one specific example, the laser gain medium include six quantum wells of $In_{x=0.56}Ga_{1-x}As_{y=0.938}P_{1-y}/In_{x=0.734}Ga_{1-x}As_{y=0.57}P_{1-y}$. In another exemplary embodiment, the laser gain medium further includes an overlayer of InP.

According to one exemplary embodiment, the hollow ring has a diameter less than 500 nm. In another exemplary embodiment, the first low index material comprises silicon dioxide that is dimensioned to reduce or eliminate formation of plasmonic modes at the first interface. In still another exemplary embodiment, the second low index material is air. According to yet another exemplary embodiment, a dimension of the second low index material along the direction of the pump light is selected to be smaller than a dimension of the first low index material along the direction of the pump light.

In another exemplary embodiment, one or more surfaces of the metal housing operate as a heat sink to facilitate cooling of the laser. In one exemplary embodiment, the laser is configured to operate as a single mode laser at room temperature. In another exemplary embodiment, the output laser light has a linewidth with a full-width-half-maximum (FWHM) value of smaller than 18 nm. In one specific embodiment, the output laser light has a linewidth with a full-width-half-maximum (FWHM) value of smaller than 3.3 nm. In still another exemplary embodiment, the laser is configured to achieve a spontaneous emission coupling factor, $\beta$, between 0.95 and 0.99. According to one exemplary embodiment, the laser is configured to produce a quality factor, Q, of at least 264. In yet another exemplary embodiment, the metal housing comprises silver. One exemplary embodiment relates to an optical communication device that includes the above noted laser, whereas another exemplary embodiment relates to an optical sensor device that includes the above noted laser.

Another aspect of the disclosed embodiments relates to a method for producing laser light that including a laser gain medium in a coaxial laser cavity that includes a central metal core and a hollow metal ring surrounding the central metal core forming an open terminal and a closed terminal. The laser gain medium is shaped in a ring and is located between the central metal core and the hollow metal ring. The closed terminal includes a metal cap that encloses the central metal rod and one side of the hollow metal ring. This method includes providing a first plug filled in the hollow metal ring between the metal cap and the laser gain medium and a second plug filled in the hollow metal ring between open terminal and the laser gain medium, directing pump light into the laser gain medium via the open terminal; and coupling laser light produced in the coaxial laser cavity from the open terminal as a laser output.

Another aspect of the disclosed embodiments relates to a coaxial laser cavity structure for producing laser light. This coaxial laser cavity structure includes a central metal core and a hollow metal ring surrounding the central metal core to collectively form a metal housing with an open terminal and a closed terminal, the closed terminal including a metal cap that encloses the central metal rod and one side of the hollow metal ring, a gain section structured as a ring and located inside the housing within the hollow ring, the gain section including a laser gain medium in contact with both the hollow metal ring and the central metal core and operable to produce an optical gain for producing laser light; a first plug section structured as a ring and located within the metal housing between the metal cap and the gain section, the first plug section including a first plug material that is different from the laser gain medium; and a second plug section structured as a ring and located within the metal housing between the gain section and the open terminal, the second plug section including a second plug material that is different from the laser gain medium.

Yet another aspect of the disclosed embodiments relates to a laser based on a coaxial laser cavity. This laser includes a metal housing including a central metal core and a hollow ring surrounding the central metal core, the metal housing including a closed terminal having a metal cap and a second open terminal; a laser gain medium filled in the hollow ring inside the metal housing that absorbs optical pump light and to produce an optical gain at a laser wavelength; a first low index material with a refractive index lower than a refractive index of the laser gain medium, the first low index material filled in the hollow ring between the metal cap and the laser gain medium to form an interface with the laser gain medium as a first cavity mirror; and a second low index material with a refractive index lower than the refractive index of the laser gain medium, the second low index material filled in the hollow ring between open terminal and the laser gain medium to form an interface with the laser gain medium as a second cavity mirror for receiving pump light for optically pumping the laser gain medium and for outputting laser light generated by the laser gain medium under the optical pump.

The above and other aspects, their implementations and advantages are described in detail in the drawings, the description and the claims.

BRIEF DESCRIPTION OF THE DRAWINGS

FIG. 2 shows optical modes for the laser structures in FIGS. 1(b) and 1(c), wherein FIG. 2(a) illustrates simulation results of electromagnetic properties of the exemplary structure shown in FIG. 1(b), and FIG. 2(b) illustrates simulation results of electromagnetic properties of the exemplary structure shown in FIG. 1(c).

FIG. 3(a) is a plot of output power versus pump power for the exemplary structure shown in FIG. 1(b) operating at a temperature of 4.5 K, FIG. 3(b) shows plots of output power versus wavelength as a function of pump power for the exemplary structure shown in FIG. 1(b) operating at a temperature of 4.5 K, FIG. 3(c) is a plot of linewidth versus pump power for the exemplary structure shown in FIG. 1(b) operating at a temperature of 4.5 K, FIG. 3(d) is a plot of output power versus pump power for the exemplary structure shown in FIG. 1(b) operating at room temperature, FIG. 3(e) shows plots of output power versus wavelength as a function of pump power for the exemplary structure shown in FIG. 1(b) operating at room temperature, and FIG. 3(f) is a plot of linewidth versus pump power for the exemplary structure shown in FIG. 1(b) operating at room temperature.

FIG. 4(a) is a plot of output power versus pump power for the exemplary structure shown in FIG. 1(c) operating at a temperature of 4.5 K, FIG. 4(b) shows plots of output power versus wavelength as a function of pump power for the exemplary structure shown in FIG. 1(c) operating at a temperature of 4.5 K, and FIG. 4(c) is a plot of linewidth versus pump power for the exemplary structure shown in FIG. 1(c) operating at a temperature of 4.5 K.

DETAILED DESCRIPTION

Figure 1A:
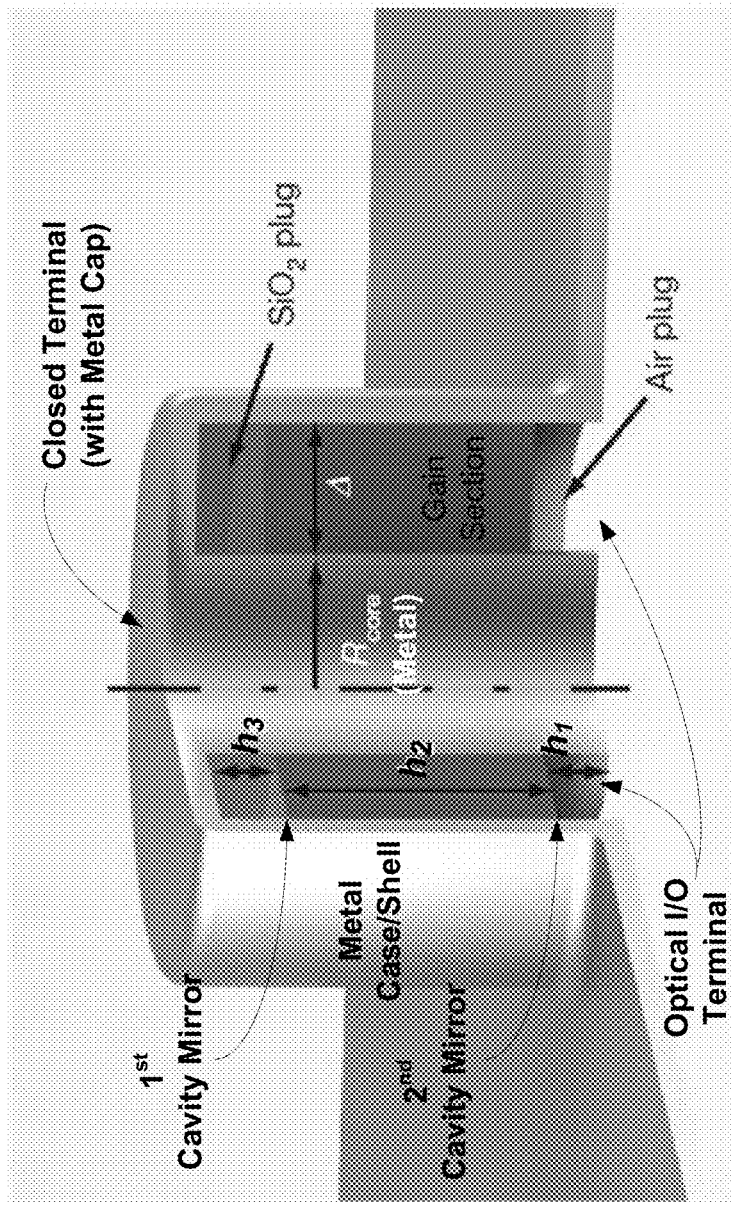
FIG. 1(a) illustrates a coaxial cavity in accordance with an exemplary embodiment.

Lasers require pump power from an outside source to produce population inversion to occur as a pre-requisite for lasing. When the gain material is pumped optically or electrically, it can reach an optical transparent state at which the optical gain equals the optical absorption and a further increase in the pump power causes the optical gain to exceed the optical loss, which is one of the basic conditions for achieving sustained coherent laser radiation. The optical loss in a laser device can be attributed to various sources, including, for example, competition of different optical modes, non-irradiative recombination processes, optical scattering and other factors. The relationship between optical gain and cavity loss results in some minimum pump power thresholds for laser operation and, in various compact laser designs, such pump power thresholds tend to be large as the volume of the laser resonators are reduced.

Specific examples of compact solid state lasers with coaxial cavity geometries described here use semiconductor gain media as examples to illustrate the structures and operations of such lasers. The disclosed nanoscale resonant cavities and lasers can be engineered to enhance the interaction between light and matter to reduce the pump energy for achieving laser operation and can be configured to provide compact laser devices for various applications including integration such lasers on chips or other application desiring small laser device volumes. For example, the disclosed laser resonator design can be configured to be scaled down without increasing the pump power threshold required for laser operation, and can be engineered to reduce the pump power threshold to a low level that is difficult to achieve in other compact laser designs. Exemplary implementations of the disclosed nanoscale laser technology have provided the demonstration of highly efficient "thresholdless" and low-threshold lasing from broadband gain media in metal based nanoscale coaxial cavities based on electrodynamical effects at subwavelength device scale, and demonstration of the smallest telecom nanolaser to date that operates in the continuous wave regime at room temperature.

The disclosed examples demonstrate the feasibility and capability of highly efficient, "thresholdless" lasers capable of utilizing essentially all of the photons emitted by the gain medium for laser operation, without any waste. The disclosed lasers can be operated based on quantum electrodynamic effects in coaxial nanocavities to eliminate, or significantly reduce, the threshold constraints in many other compact laser cavity designs. One feature of the disclosed embodiments relates to design and fabrication of nanocavities with high cavity quality factors and Purcell factors that support a single laser mode, thus eliminating mode competition and allowing thresholdless operation. For example, the disclosed lasers can include a metal center core surrounded by a metallic hollow ring and a metal cap that encloses one end of the center core and the metal ring. Surrounding the metal core is a semiconductor gain material that, for example, includes a quantum well structure that provides the desired optical gain for lasing when optically pumped by optical pump light. The disclosed laser cavities can be sized at small dimensions at or smaller than the lasing wavelengths. The disclosed lasers can be configured to have a diameter that is about one half of a micron or smaller dimensions. The disclosed lasers require very low power to operate, an important breakthrough, since compact lasers in other designs tend to require increased pump power levels to begin lasing as they shrink to nanoscale sizes.

Nanolaser and nanolaser arrays of the disclosed technology can be used in various applications, including applications in ultrahigh throughput and density sensors (e.g., biochemical sensors), high resolution display devices, and ultrafast laser sources in optical communication devices and systems including laser pulses in Terahertz ranges. The disclosed nanolasers can be useful in augmenting computing chips with optical communications, e.g., in which the lasers are used to establish communication links on the chip. Only a small amount of pump power would be required to initiate and sustain lasing, e.g., thereby reducing the number of photons needed to transmit information. In addition, the cavity can be very useful in making highly efficient ultrafast lasers, which can be applied in a variety of applications, e.g., including lighting. For example, the small size and extremely low power of these nanolasers can make them very useful components for photonic circuits packed on to tiny computer chips. In addition, the disclosed lasers can aid in the development of new metamaterials, artificially structured materials that are already being studied for applications from superlenses that can be used to see individual viruses or DNA molecules to "cloaking" devices that bend light around an object to make it appear invisible.

Some of the disclosed embodiment relate to methods to design a laser cavity to become thresholdless. For example, thresholdless nanoscale coaxial lasers of the disclosed embodiments are both small in size and in the size of its mode. Examples are described herein showing the smallest room-temperature, continuous wave laser to date, e.g., in which the threshold of the described devices are lower than existing laser and in which the modulation speed is substantially faster. The exemplary thresholdless nanoscale coaxial lasers are capable of functioning at room temperature and under CW pumping conditions.

In one aspect, the disclosed technology includes devices, systems, and methods for room-temperature, continuous-wave lasing, as well as low-temperature thresholdless lasing in a spectrally broadband semiconductor gain medium.

The effects of cavity quantum electrodynamics (QED), caused by the interaction of matter and the electromagnetic field in subwavelength resonant structures, have been the subject of intense research in recent years. The generation of coherent radiation by subwavelength resonant structures has attracted considerable interest, not only as a means of exploring the QED effects that emerge at small volume, but also for its potential in applications ranging from on-chip optical communication to ultrahigh resolution and high-throughput imaging, sensing and spectroscopy. One such strand of research is aimed at developing the next generation nanolasers: a scalable, low-threshold, efficient source of radiation that operates at room temperature and occupies a small volume on a chip. Different resonators have been proposed for the realization of such a nanolaser, e.g., microdisk and photonic bandgap resonators, and, more recently, metallic, metallodielectric and plasmonic resonators. But progress towards realizing the ultimate nanolaser has been hindered by various factors, including lack of proper technology for scaling down the size of the laser cavities without significantly increasing the threshold power required for lasing.

The described technology includes a family of coaxial nanostructured cavities that address the resonator scalability challenge by using certain cavity design features, including the cavity geometries, metal and dielectric material compositions or selections. The disclosed technology utilizes coaxial nanocavities with plasmonic excitations at the interface between the metal and the laser gain material to produce ultrasmall, room-temperature, laser devices. Such lasers can be used for continuous-wave laser operations at telecommunications frequencies. In addition, by further modifying the design of these coaxial nanocavities, the disclosed lasers can achieve thresholdless lasing with a broadband gain medium. In addition to enabling laser applications, these nanoscale resonators can provide a powerful platform for the development of other QED devices and metamaterials in which atom-field interactions generate new functionalities.

Consider two of the technical challenges in miniaturization of laser resonators using dielectric or metallic material structures faces. One challenge is the (eigen-)mode scalability, e.g., implying the existence of a self-sustained electromagnetic field regardless of the cavity size. The other challenge is a constraint imposed by a relationship between optical gain and cavity loss which results in an undesirably large lasing threshold as the volume of the resonator is reduced. The disclosed technology demonstrates a new approach to nanocavity design that can be used to address both challenges. For example, subwavelength-size nanocavities with mode spatial dimensions smaller than the operating wavelength are realized by designing a plasmonic coaxial resonator that supports the cut-off-free transverse electromagnetic (TEM) mode. Also, for example, the high lasing threshold for small resonators is reduced by utilizing cavity QED effects, causing high coupling of spontaneous emission into the single lasing mode. This new laser design approach can address the threshold constraint by reaching so-called thresholdless lasing, which occurs when every photon emitted by the gain medium is funneled into the lasing mode.

Figures 1B, 1C:
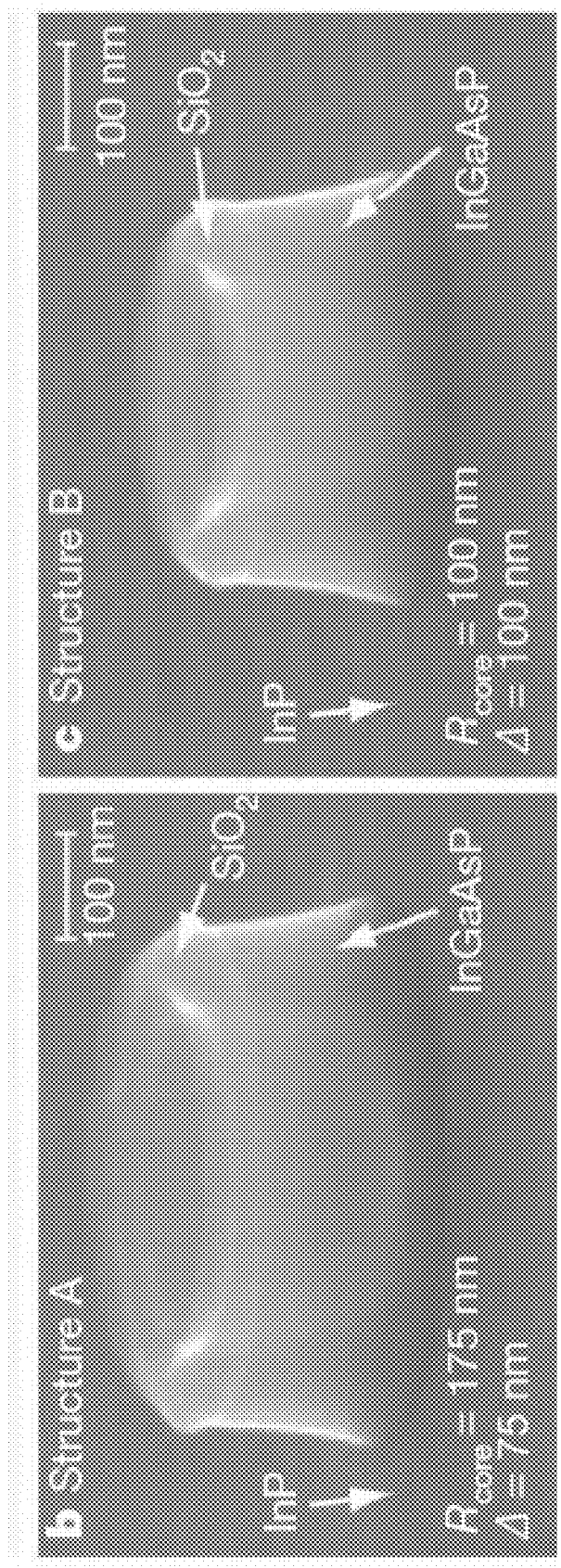
FIG. 1(b) illustrates a specific example of the coaxial cavity structure of FIG. 1(a).
FIG. 1(c) illustrates another specific example of the coaxial cavity structure of FIG. 1(a).

FIG. 1(a) shows one example of a nanoscale coaxial laser cavity in which the laser gain medium for producing the laser gain for laser action is shown having a height $h_1$ and is marked as "Gain Section." The thickness of the gain-medium-ring is designated with $\Delta$. FIGS. 1(b) and 1(c) show scanning electron microscope (SEM) images of the constituent rings in structure A and structure B, respectively. A side view of the rings comprising the coaxial structures is seen; the rings include a dielectric material (e.g., $SiO_2$) on top, and a laser gain medium region (e.g., a quantum-well gain region) underneath.

In this example, a coaxial waveguide is provided as part of the cavity that supports plasmonic modes and includes a metallic rod and a metal-coated semiconductor gain material ring surrounding the metallic rod. Outside the semiconductor gain material ring is a cylindrical metal shell in direct contact with the semiconductor gain material ring. A metal cap closes one end of the cylindrical metal shell to provide a space between the metal cap and one side of the semiconductor gain material ring. A dielectric material with a refractive index lower than the semiconductor gain material (e.g., silicon dioxide) is filled in this space between the metal cap and the semiconductor gain material ring. On the other side of the semiconductor gain material ring within the cylindrical metal shell is an open space for receiving optical pump light and being filled with air or a dielectric material with a refractive index lower than the semiconductor gain material. The impedance mismatches at the two sides of the semiconductor gain material ring within the cylindrical metal shell effectuate two optical reflectors which form an optical resonator for the laser. The additional metal coverage on top of the device and thin, low-index dielectric plugs of silicon dioxide ($SiO_2$) at the top end of the coaxial waveguide improves the mode confinement. One of the functions of the top low index dielectric plug (e.g., $SiO_2$) is to prevent the formation of undesirable plasmonic modes at the top interface, between the top metal cap and the semiconductor gain medium. The low-index dielectric plug on the other end provides an optical input/output port to allow pump energy into the cavity and also to couple out the light generated in the coaxial resonator. The metal in the sidewalls of the coaxial cavity is placed in direct contact with the semiconductor gain material to ensure the support of plasmonic modes, providing a large overlap between the modes of the resonator and the emitters distributed in the volume of the gain medium. In addition, the metallic coating serves as a heat sink that facilitates room-temperature and continuous-wave operation.

To reduce the lasing threshold, the coaxial structures are designed to maximize the benefits from the modification of the spontaneous emission due to the cavity QED effects. Because of their small sizes of such nanoscale coaxial structures, the frequency spacing of different optical modes in such a cavity tends to be large so that the modal content of the nanoscale coaxial cavities is sparse. This condition facilitates high spontaneous emission coupling into the single lasing mode of the resonator. The cavity modal content can be further controlled or modified by tailoring the coaxial cavity geometry, e.g., the radius of the core, the width of the ring, and the height of the gain medium and the low-index plugs. The number of modes supported by the resonator that can participate in the lasing process is ultimately limited to one of the optical frequencies that coincide with the gain bandwidth of the semiconductor gain material.

The coaxial structures based on the design in FIG. 1(a) and other designs in this document can use various laser gain materials to produce laser light at desired laser wavelengths. Semiconductor gain materials can be configured or engineered to provide optical gains for lasing operations at various laser wavelengths from UV or blue spectral ranges, visible spectral ranges, infrared ranges and spectral ranges beyond wavelengths between 1 micros and 2 microns. Semiconductor quantum well structure gain materials can be configured to exhibit broad gain bandwidths to enable lasing operations in the disclosed coaxial structures in suitable laser wavelengths by tailoring the cavity geometries and dimensions. In one exemplary embodiment, the semiconductor gain medium can include six quantum wells of $In_{x=0.56}Ga_{1-x}As_{y=0.938}P_{1-y}$ (e.g., 10 nm thick)/$In_{x=0.734}Ga_{1-x}As_{y=0.57}P_{1-y}$ (e.g., 20 nm thick) to produce a gain bandwidth that spans frequencies corresponding to wavelengths in vacuum from 1.26 mm to 1.59 mm at room temperature (295 K), and from 1.27 mm to 1.53 mm at a temperature of 4.5K.

FIGS. 1(b) and 1(c) illustrate two exemplary geometries of the structure that shown in FIG. 1(a) in form of scanning electron microscope (SEM) images. The first exemplary structure, depicted in FIG. 1(b) and referred to as structure A, has an inner core radius of $R_{core}$=175 nm, a gain-medium-ring with a thickness of $\Delta$=75 nm, a lower plug height of $h_1$=20 nm, a quantum-wells height of 200 nm covered by a 10-nm overlayer of InP, resulting in a total gain-medium height of $h_2$=210 nm, and an upper plug height of $h_3$=30 nm. The second exemplary structure, depicted in FIG. 1(c) and referred to as structure B, is smaller in diameter, having $R_{core}$=100 nm and $\Delta$=100 nm. The heights of the plugs and gain medium are identical to those of structure A. It should be noted that the height of lower plug, $h_1$, is selected to be smaller than the upper plug $h_3$. The short height at the open end of the nanostructure facilitates the coupling of light to allow operation of the laser cavity in accordance with the disclosed embodiments.

Figure 1D:
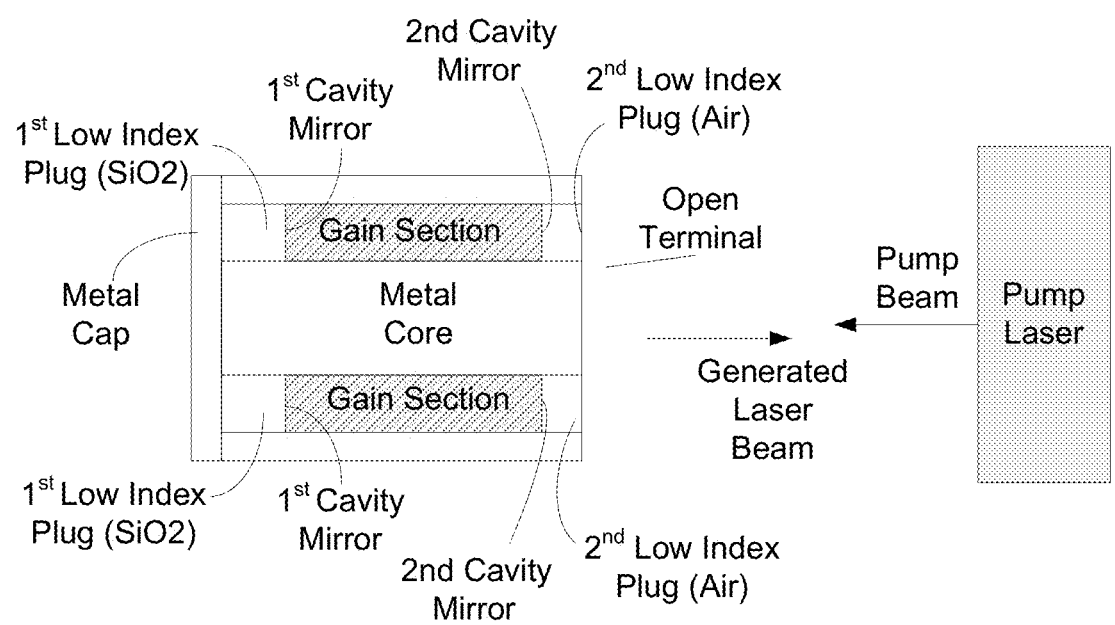
FIG. 1(d) illustrates an exemplary optical system including a pump laser for use with a coaxial cavity laser in accordance with an exemplary embodiment.

FIG. 1(d) further shows the structure of the coaxial laser in FIG. 1(a) under optical pumping by a pump laser in accordance with an exemplary embodiment. The coaxial laser in FIG. 1(d) shows a closed terminal formed by a metal cap that encloses the first low index plug (e.g., SiO2) and an open terminal with a metal center facet formed by the end facet of the metal core and a ring of the second low index plug (e.g., air). The interface between the first low index plug and the gain medium close to the closed terminal forms an impedance mismatch at the interface, causing at least a portion of the light that propagates through the gain medium to be reflected (analogous to forming a first cavity mirror for the laser cavity). In addition, the metal cap operates as a second reflecting surface to further reflect radiation that is transmitted through the first low index plug to be directed back towards the gain medium. The interface between the gain medium and the second low index plug close to the open terminal also forms an impedance mismatch at that interface, causing at least a portion of the light that propagates through the gain medium to be reflected (analogous to forming a second cavity mirror). The first low index material for the first low index plug has a refractive index lower than a refractive index of the laser gain medium and the second low index material for the second low index plug has a refractive index lower than the refractive index of the laser gain medium. The second low index material can transmit light to facilitate receiving pump light and outputting laser light. The gain medium, in one exemplary embodiment, includes a series of quantum well structures that are perpendicular to the optical axis of the cavity (which is parallel to the direction of the pump beam). The open terminal also serves as the optical input and output (I/O) terminal for receiving the pump light from the pump laser and for outputting generated laser light inside the laser cavity as the output laser light. Input/output optics can be provided at the open terminal to facilitate optical pumping and directing the laser output.

Figure 2:
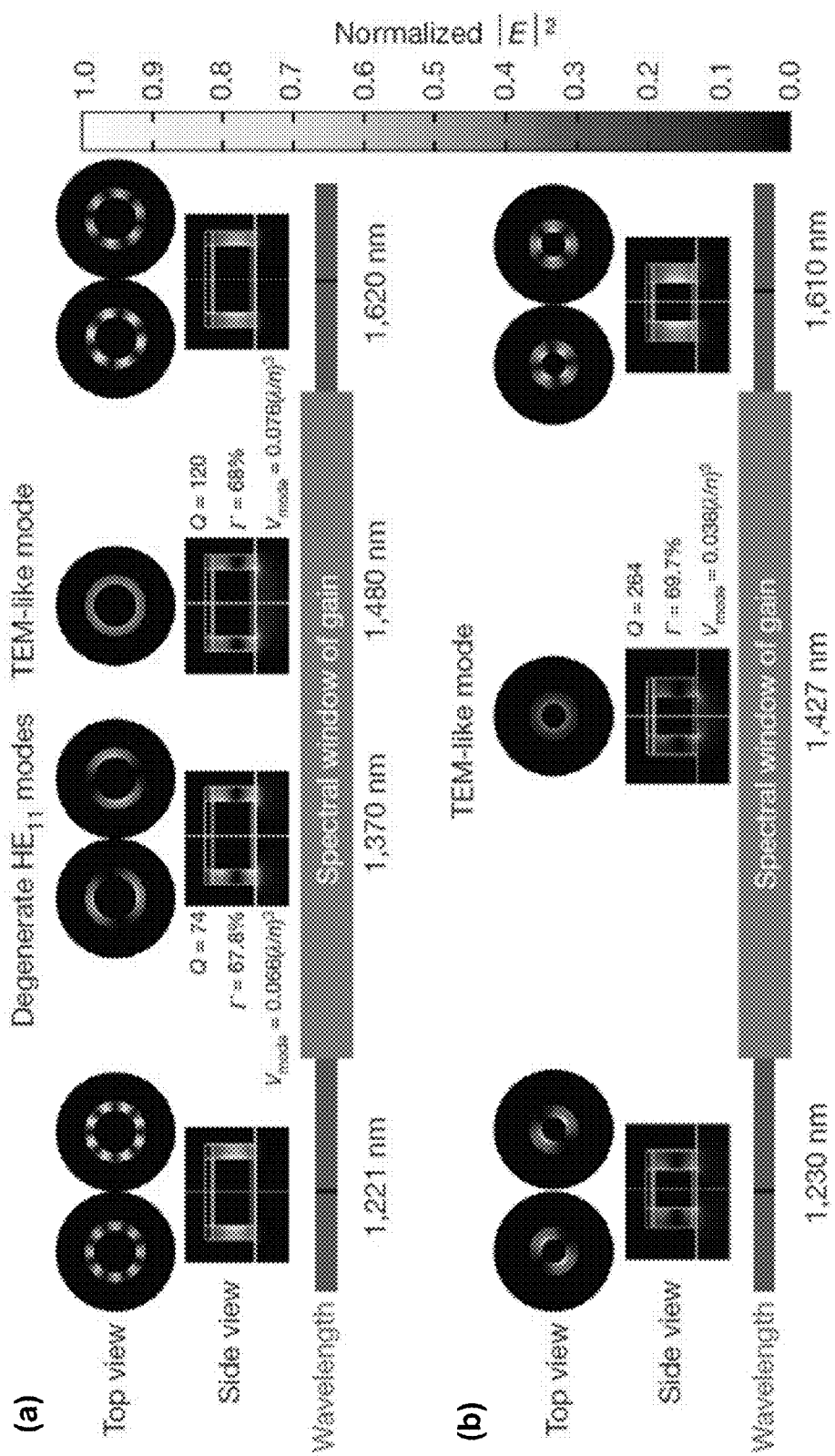

FIG. 2(a) shows the simulation results of the modal spectrum modeled using the three-dimensional finite element method (FEM) eigenfrequency solver in the radio-frequency package of COMSOL Multiphysics for the cavity of structure A of FIG. 1(b) at a temperature of 4.5 K. FIG. 2(b) shows the simulation results of the modal spectrum for the cavity of structure B of FIG. 1(c) at a temperature of 4.5 K. The terms refer to as follows: Q: quality factor; Γ: factor giving extent of energy confinement to the semiconductor region; Vmode: the effective modal volume. The color bar on the right-hand side shows normalized $|E|^2$, where E is the electric field intensity. Nominal permittivity values are used in this simulation.

FIG. 2(a) shows that, for structure A, the fundamental TEM-like mode and the two degenerate $HE_{11}$ modes are supported by the resonator and fall within the gain bandwidth of the gain material. This exemplary simulation is also repeated for structure A with room-temperature material parameters, showing that for structure A at room temperature, the two degenerate $HE_{11}$ modes are red-shifted to 1,400 nm, and exhibit a reduced quality factor of Q≈35, compared to Q≈47 at 4.5 K. The TEM-like mode is red-shifted to 1,520 nm with Q≈53, compared to Q≈120 at 4.5 K. All cavity quality factors are at transparency, meaning that the imaginary part of the gain medium's permittivity is set to zero in the calculations. The exemplary simulations are performed with nominal values for the permittivity of the active medium and metal at 4.5 K and at room temperature.

The simulation results in FIG. 2(b) indicate that structure B supports only the fundamental TEM-like mode at a temperature of 4.5 K. The quality factor Q≈265 for this mode is higher than that of structure A. In general, the metal coating and the small aperture of the nanoscale coaxial cavity inhibit the gain emitters from coupling into the continuum of the free-space radiation modes. Hence, the single-mode cavity of structure B exhibits a very high spontaneous emission coupling factor (β≈0.99), approaching the condition for an ideal thresholdless laser. The spontaneous emission factor is calculated by placing randomly oriented and randomly positioned dipoles in the active area of the cavity, and then computing their emitted power at different wavelengths. The β-factor is given by the emitted power that spectrally coincides with the lasing mode, divided by the total emitted power.

Characterization of the nanoscale coaxial lasers was performed under optical pumping with a λ=1,064 nm laser pump beam in continuous-wave and pulsed regime. Additional details on the measurement system are provided in a later section of this document. Excitation of the cavity modes is confirmed by the measurements of the far-field emission from the devices. These measurements for structure A confirm that, at a temperature of 4.5 K, the beam is radially polarized, and the radiation pattern for the TEM-like mode of the cavity shows that, in the far field, the beam has radial polarization and a null at the center that is caused by phase singularity. In these measurements, the beam from structure A is collected under pulsed mode pumping. Similar measurements were conducted for structure A at room temperature, and structure B at 4.5 K, and for another structure with $R_{core}$=175 nm and Δ=125 nm. These experiments indicate that while the far-field radiation pattern of structure A and the thresholdless laser of structure B have doughnut shapes, the profile of the laser with $R_{core}$=175 nm and Δ=125 nm has two distinct lobes in the far-field, ruling out the possibility of operation in the TEM-like mode. In all cases, the effect of the cavity on the spatial emission profile was evident, which confirms the formation of the modes in the cavity.

Figure 3:
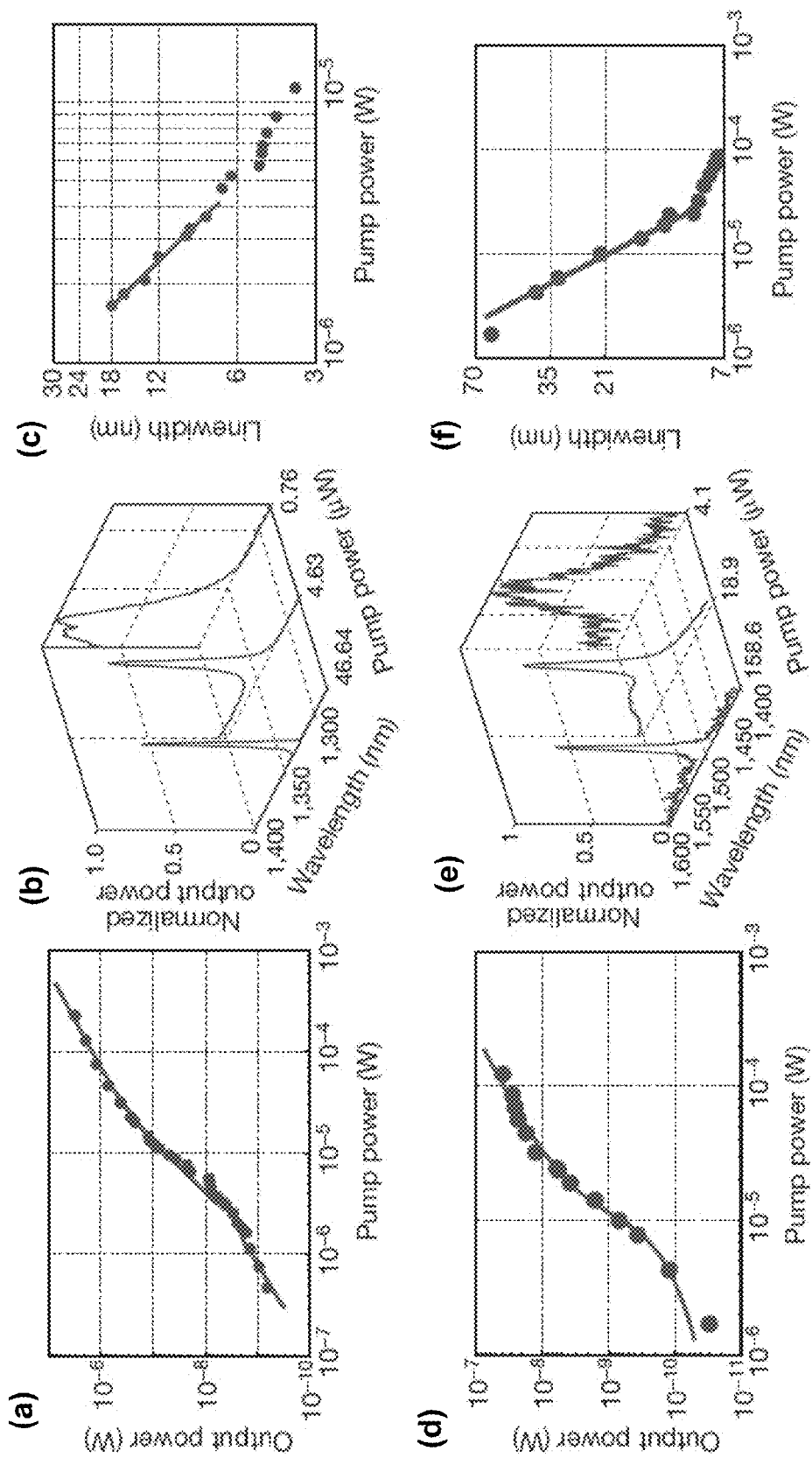
FIG. 3 shows measurements of the laser structure in FIG. 1(b) where

Top row in FIG. 3 shows the emission characteristics of the nanoscale coaxial laser of structure A operating at 4.5 K that include the Output Power vs. Pump Power—aka the light-light curve—of FIG. 3(a), the spectral evolution of FIG. 3(b), the linewidth vs. Pump Power of FIG. 3(c). The bottom row in FIG. 3 (i.e., FIGS. 3(d)-(f)) show similar plots as the top row but for laser operating at room temperature. The pump power is calculated as the fraction of the power incident on the laser aperture. The solid curves in FIG. 3(a) and FIG. 3(d) are the best fit of the rate-equation model for data points that are shown as closed circles. The solid lines fitted onto the data points in FIG. 3(c) and FIG. 3(f) show the inverse power narrowing rate of the linewidth. The resolution of the monochromator was set to 3.3 nm.

The light-light curves of FIG. 3(a) and FIG. 3(d) show standard laser action behavior, where spontaneous emission dominates at lower pump powers (referred to as the photoluminescence region), and stimulated emission is dominant at higher pump powers (referred to as the lasing region). The photoluminescence and lasing regions are connected through a pronounced transient region, referred to as amplified spontaneous emission (ASE). The evolution of the spectrum shown in FIGS. 3(b) and (e) also confirms these three regimes of operation. The spectral profiles at low pump powers reflect the modification of the spontaneous emission spectrum by the cavity resonances depicted in FIG. 2(a). The linewidth of the lasers shown in FIG. 3(c) and FIG. 3(f) narrows with the inverse of the output power at lower pump levels (the solid trend line). This is in agreement with the well-known Schawlow-Townes formula for lasers operating below threshold. Around threshold, in semiconductor lasers the rapid increase of the coupling between the gain coefficient and the refractive index of the gain medium slows down the narrowing of the linewidth, until charge carrier pinning resumes the modified Schawlow-Townes inverse power narrowing rate. In practice, only a few semiconductor lasers are shown to have above-threshold linewidth behavior that follows the modified Schawlow-Townes formula. In most reported lasers, the linewidth behavior differs distinctly from the inverse power narrowing rate. The mechanisms affecting the above-threshold linewidth, especially for lasers with high spontaneous emission coupling to the lasing mode, are still a subject of research.

It should be noted that while the above discussion of a thresholdless laser has been presented using exemplary structures A and B with specific dimensions and material, it is understood that using the disclosed techniques, structures with other dimensions and metal coatings, other gain media and other lower and upper plugs can be systematically dimensioned and selected to effectuate thresholdless lasing at other wavelengths and/or other optical characteristics.

An exemplary rate-equation model was adopted to study the dynamics of the photon-carriers interaction in the laser cavities. Details of the rate equation model are provided in a later section in this document. The light-light curves obtained from the rate-equation model for the laser of structure A are shown as solid lines in FIG. 3(a) and FIG. 3(d). For example, for the laser operating at 4.5 K, by fitting the rate-equation model to the experimental data, almost 20% of the spontaneous emission was found to be coupled to the lasing mode, which is assumed to be the mode with the highest quality factor (TEM-like mode). This assumption is validated by examining the far-field radiation pattern and the polarization state of the output beam, as noted earlier. At room temperature, the surface and Auger non-radiative recombination processes dominate. As the carriers are lost through non-radiative channels, the ASE kink of the laser is more pronounced, and, as expected, the laser threshold shifts to higher pump powers.

Figure 4:
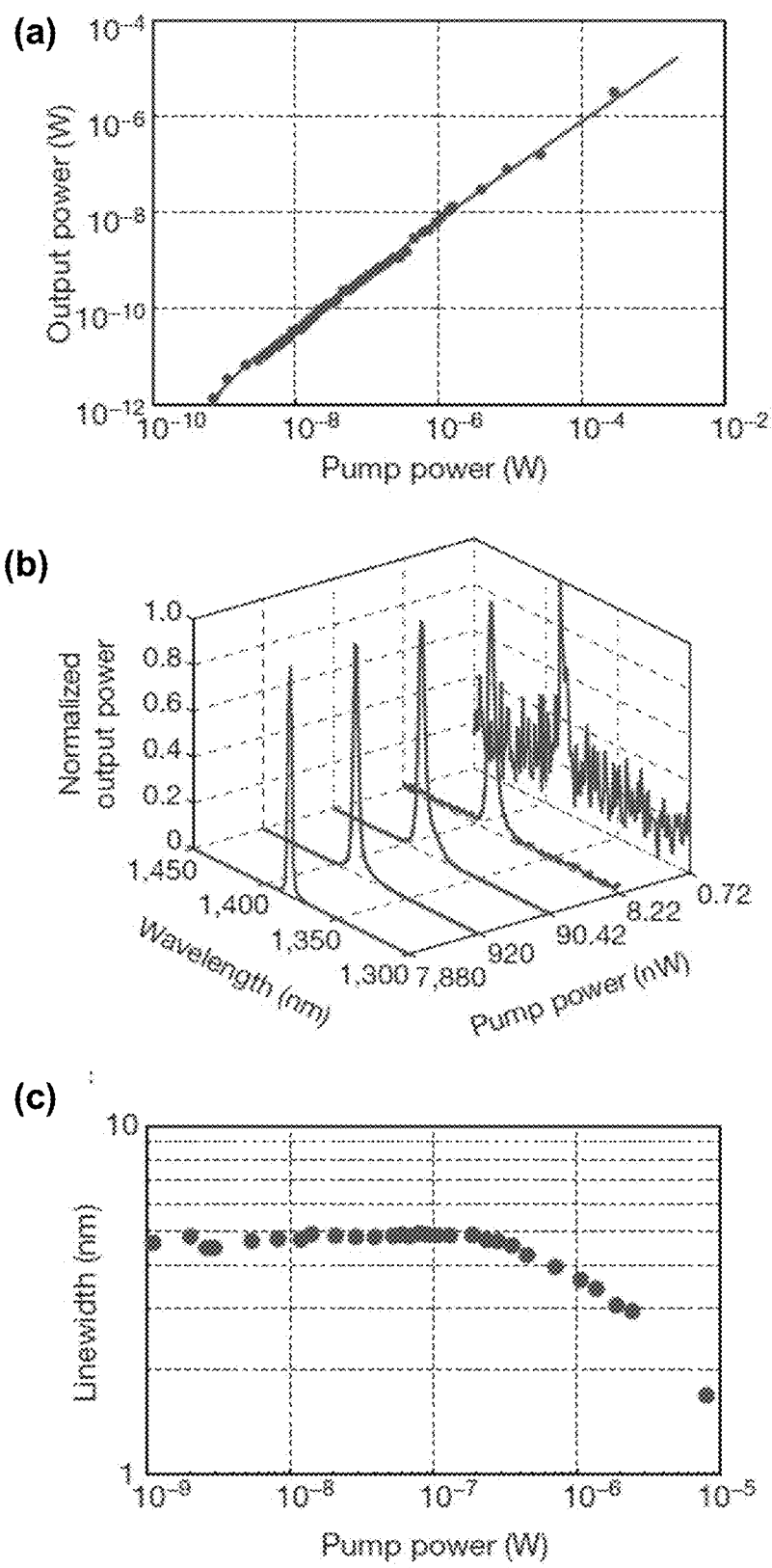
FIG. 4 shows measurements of the laser structure in FIG. 1(c) where

The emission characteristics of structure B were also examined. According to the electromagnetic analysis (see, e.g., FIG. 2(b)), this structure is expected to operate as a thresholdless laser, as only one non-degenerate mode resides within the gain medium's emission bandwidth. The emission characteristics of structure B at 4.5 K are shown in FIGS. 4(a) through 4(c). FIG. 4(a) is the light-light curve shows the relationship between the output power and pump power. FIG. 4(b) shows the spectral evolution as the pump power is increased and FIG. 4(c) illustrates the linewidth evolution as a function of pump power. The pump power in FIGS. 4(a) to 4(c) are calculated as in FIG. 3, and the solid curve in FIGS. 4(a) and 4(c) is the best fit of the rate-equation model. The resolution of the monochromator was set to 1.6 nm.

The light-light plot of FIG. 4(a), which follows a straight line with no pronounced kink, confirms the thresholdless lasing behavior. The thresholdless behavior is further manifested in the spectral evolution of FIG. 4(b), where a single narrow, Lorentzian-like emission is obtained over the entire five-orders-of-magnitude range of pump power. This range spans from the first signal detected above the detection system noise floor at 720 pW pump power, to the highest pump power of more than 100 mW. Because the homogeneously broadened linewidth of the gain medium is larger than the linewidth of the observed emission, the emission profile is attributed to the cavity mode. The measured linewidth at low pump power (i.e., $\Delta\lambda_{FWHM} \approx 5$ nm) agrees with the cavity Q-factor of the TEM-like mode at transparency. Further, the measured radiation pattern, discussed earlier, confirm the electromagnetic simulation given in FIG. 2(b).

The assertion that the device indeed reaches lasing is further substantiated by careful study of the linewidth behavior. At low pump levels, the linewidth depicted in FIG. 4(c) is almost constant, and does not narrow with output power, implying that the linewidth shows no subthreshold behavior. The lack of variation of linewidth with pump power is most likely the result of the increasing gain-index coupling, which is a well-known around-threshold behavior in semiconductor lasers. Another indication, and more decisive proof that structure B does not exhibit subthreshold behavior, is that the linewidth narrowing above the 100 nW pump power level does not follow the inverse power narrowing rate that is clearly identified in structure A. The observed narrowing rate for this laser is attributed to the carrier-pinning effect, as further corroborated by the results of the rate equations model for the carrier density presented later in this document (see, e.g., FIG. 6). This linewidth behavior has never been reported in any laser, and is unique to the disclosed thresholdless laser.

Referring back to FIG. 4(a), the best fit of the disclosed rate-equation model to the experimental data is achieved if 95% of the spontaneous emission is coupled to the lasing mode ($\beta=0.95$). The deviation from $\beta=0.99$ predicted by the electromagnetic simulation can be attributed to other non-radiative recombination processes that have not been considered in the rate-equation model, and to the spectral shift of the mode at higher pump levels that causes variations in the available gain for the mode. In summary, all the experimental observations, including output spectrum and beam profile, electromagnetic simulations, rate equation model, and comparison with the non-thresholdless lasers, confirm that thresholdless lasing satisfactorily explains all aspects of the emission of the light-emitting device based on structure B at 4.5 K.

The thresholdless lasing in nanoscale coaxial cavities of the disclosed embodiments clearly differs from the expensive state-of-the-art, high-quality-factor, photonic-bandgap structures. For example, thresholdless lasing that is obtained in accordance with the disclosed embodiments utilizes a coaxial cavity that includes a closed metal cap at one end (see, for example, FIG. 1 (a) for an exemplary configuration). For another example, thresholdless lasing that is obtained in accordance with the disclosed techniques and devices, utilizes a broadband gain medium with a low-quality-factor, single-mode metal cavity. Smaller size, straightforward fabrication procedure, and better thermal properties are just a few of the advantages of nanoscale coaxial cavities of the disclosed embodiments for the realization of thresholdless lasing.

The disclosed embodiments have demonstrated room-temperature, continuous-wave lasing with nanoscale coaxial structures, as well as low-temperature thresholdless lasing in a spectrally broadband semiconductor gain medium. Owing to the fundamental TEM-like mode with no cut-off, these cavities support ultra-small modes, offer large mode-emitter overlap that results in optimal utilization of the pump power, and provide multifold scalability.

Exemplary implications of the disclosed technology can include the following examples. In one example, the demonstrated nanoscale coaxial lasers have a great potential for future nano-photonic circuits on a chip. In another example, thresholdless operation and scalability provide the first systematic approach toward the realization of QED objects and functionalities, specifically the realization of quantum metamaterials. In another example, this new family of resonators paves the way to in-depth study of the unexplored physics of emitter-field interaction, photon statistics, and carrier dynamics in ultra-small metallic structures.

The disclosed coaxial nanolaser cavities can be fabricated using suitable microfarication techniques and processes. The following procedures and parameters were used for fabrication of the devices in various testing devices as disclosed. Tested nanoscale coaxial cavities were fabricated using standard nano-fabrication techniques. The gain material in the tested devices had six quantum wells of $In_{x=0.734}Ga_{1-x}As_{y=0.57}P_{1-y}$ (20 nm)/$In_{x=0.56}Ga_{1-x}As_{y=0.938}P_{1-y}$ (10 nm), with an overall height of 200 nm, grown on p-type InP substrate (fabricated at OEpic Semiconductors Inc.). For protection, the quantum wells were covered by a 10 nm thick InP over-layer. Hydrogen silsesquioxane (HSQ) solution in methyl isobutyl ketone (MIBK) was used as a negative tone inorganic electron beam resist. The concentration ratio of HSQ (FOX12) and MIBK was adjusted, such that an almost 50 nm thick resist was spun on the wafer. The resist was then soft baked, and rings with different inner radii and widths were written by electron beam exposure. The electron beam converted the HSQ resist to an amorphous structure, similar to SiO2. The patterned wafer was then immersed in tetramethylammonium hydroxide (TMAH) for 180 seconds, and rinsed in isopropyl alcohol (IPA) for 60 seconds. The exposed HSQ served as a mask for the subsequent reactive ion etching process that utilized $H_2$:$CH_4$:Ar plasma, with gas proportions of 40:4:20 standard cubic centimeter (sccm), respectively, and operated with RIE power of 150 W, at chamber pressure of 30 mTorr, and temperature of 40 C (Trion).

After dry etching, the samples were studied under a scanning electron microscope (SEM). Then, the wafer was cleaned with oxygen plasma to remove organic contaminations and any polymers that were built up during the dry etch process. A standard oxygen cleaning procedure was used, with 50 sccm flow of $O_2$, and RIE power of 150 W, at a chamber pressure of 50 mTorr and temperature of 40 C (Trion). In the next step, the alloy of silver and aluminum (98% Ag+2% Al) was deposited using e-beam evaporation. The existence of Aluminum impurity in the silver target was not intentional. It was detected by x-ray spectroscopy of the target, and it was not verified whether or how the aluminum impurity affects the performance of the fabricated devices.

The sample was then immediately glued, upside down, to a piece of silicon wafer with silver epoxy, heated to the temperature of 120 C for 10 minutes to cure the silver epoxy, and dipped in hydrochloric acid for approximately 45 minutes to remove the InP substrate and to open up the air-plug aperture.

The device properties of the disclosed coaxial lasers were simulated by using finite element method (FEM) simulation under the following choice of various parameters and material constants for two different operating temperatures. For simulation at 4.5 K, $\epsilon_{silver}=-120.43-0.03073i$ was used for silver permittivity, $\epsilon_g=11.15$ was used for gain-medium permittivity, $\epsilon_{InP}=9.49$ was used for InP permittivity, $\epsilon_{SiO2}=2.1$ was used for $SiO_2$ permittivity, and $\epsilon_{air}=1$ was used for air permittivity. For simulation at the room temperature, the permittivities are the same as at T=4.5 K, except $\epsilon_{silver}=-120.43-3.073i$, $\epsilon_g=11.56$, and $\epsilon_{InP}=9.86$.

In characterizing tested devices, the following measurements and conditions were used to measure the various characteristics of the devices. The nanoscale coaxial structures were optically pumped with a 1064 nm laser beam (SPI fiber laser) focused to an area of ~64 $\mu m^2$ on the sample surface. A microscope objective with a numerical aperture of 0.4 was used to focus the pump beam, as well as to collect the output light from the samples. Alignment of the pump beam to the desired cavity was performed by imaging the sample surface through two cascaded 4-f imaging systems onto an infrared (IR) CCD camera (Indigo Alpha), using a broadband IR light source. Lasing was observed both at room temperature and at 4.5 K under continuous wave (CW) and pulsed mode pumping (12 ns pulse width at 300 kHz repetition rate) conditions.

Output spectra were obtained using a monochromator (CVI Digikrom DK480) in conjunction with an electrically cooled InGaAs detector (EOsystems) and digital lock-in amplifier (Stanford Research Systems). Monochromator resolution was set to 3.3 nm by opening up the slits. This relatively large slit size was chosen to avoid power loss at the monochromator input slit. In some measurements, emission linewidths (FWHM) smaller than 3.3 nm were measured, with monochromator resolution set to 1.65 nm and 0.67 nm.

For the light-light curves at lower pump levels, the data were collected under continuous wave pumping, because the sensitivity of the detection system was too low to detect the signals generated by pulsed pumping. At very high power levels, the data was collected under pulsed mode pumping, due to the limited available CW power from the pump laser. Continuous wave and pulsed mode measurements were performed with adequate overlap in the 3-25 $\mu W$ pump power region to ensure that the two sets of data, after scaling, are consistent. The reported pump power was calculated by taking the ratio of the nanoscale coaxial aperture to the pump laser spot size (64 $\mu m^2$) and multiplying it by the total pump laser power. Only the output power collected by the objective lens with the numerical aperture of 0.4 was considered toward the reported output power. The reported output power was calculated by integrating the power per unit of wavelength (1 nm) over the spectral extent of the mode.

Cryogenic measurements were performed by placing the structures in a continuous-flow microscopy cryostat (Janis ST-500) that was cooled with liquid helium to the temperature of 4.5 K. A rigorous electromagnetic simulation (FEM simulation with COMSOL Multiphysics) was performed to calculate the portion of the pump power that is absorbed by the gain media in the reported lasers. A plane wave at $\lambda=1064$ nm was incident on the aperture of the device, and the power absorbed by the gain region was calculated. Material parameters of $\epsilon_g=13-0.6i$ and $\epsilon_{Ag}=-57-0.6i$ were used for the permittivities of InGaAsP quantum wells and silver, respectively. The portion of the pump power absorbed by the gain medium does not show significant dependence to the metal loss (imaginary part of the metal permittivity). For the exemplary laser of structure A of FIG. 1(b), the absorbed pump is 65 percent of the power impinged on the aperture of the device. For the exemplary laser of structure B of FIG. 1(c), this value is 90 percent.

As part of the processes in designing the disclosed coaxial lasers, a simplified rate equation model for the lasing operations was used to aid the design processes. An overview of this simplified rate equation model is provided below. Assuming photon number $S_i$ in each mode at frequency $\omega_i$ and the total carrier number N, the rate equations are as represented by Equation (1) as follows:

$$\frac{dS_i}{dt} = \left(\Gamma_i \int g_{(n,\omega)} L_{(\omega-\omega_i)} d\omega - \frac{\omega_i}{Q_i}\right) S_i + \Gamma_i \int e_{(n,\omega)} L_{(\omega-\omega_i)} d\omega \quad (1)$$

$$\frac{dN}{dt} = \alpha_{p(n,\omega_p)} P - \sum_i \left(\Gamma_i \int g_{(n,\omega)} L_{(\omega-\omega_i)} d\omega\right) S_i -$$

$$\sum_i \Gamma_i \int e_{(n,\omega)} L_{(\omega-\omega_i)} d\omega - \frac{N}{\tau_r} - \frac{N}{\tau_{nr}}$$

In the above equation, P is the pump photon number at frequency $\omega_p$, and $L_{\omega-\omega i}$ is the normalized Lorentzian function centered at the cavity mode frequency, with width determined by the cavity mode quality factor (Q) obtained in the FEM simulation. Small variations in the inner and outer diameter of the gain medium rings, as well as the length of the plugs, causes the central frequency of the cavity modes to shift. The frequency of the modes were determined from the modal spectral evolution (see, e.g., FIGS. 3 and 4), and were incorporated into the rate equation model. The quality factors and the modal overlaps $\Gamma_i$, between the mode volume and the quantum wells volume $V_g$, are less sensitive to cavity dimensions and were taken from the FEM simulation results. However, the uncertainty in the simulation parameters introduces some level of flexibility in the exact values used in the model.

The spectral dependence of gain and spontaneous emission on the carrier density $n=N/V_g$, as well as the pump absorption coefficient, were calculated via the quantum wells gain model, assuming uniform distribution of carriers among the wells, and taking into account the bandgap temperature, carrier induced shrinkage, and homogeneous broadening due to the intraband scattering relaxation. The spontaneous emission rate into the free space modes was calculated via the free space density of states according to the Equation (2) below:

$$\tau_r^{-1} = \frac{1}{F} \int \frac{n^2 \omega^2}{\pi^2 c^2} \hat{e}_{(n,\omega)} d\omega \quad (2)$$

In Equation (2), the modified spontaneous emission e takes into account the random polarization of the field. Factor F is a free parameter that quantifies the inhibition of the spontaneous emission into the free space modes, and it is varied to fit the shape of the experimental light-light data. The non-radiative, recombination lifetime represented by Equation (3) below accounts for surface and Auger recombination:

$$\tau_{nr}^{-1} = A \cdot s_g / V_g + C n^2 \quad (3)$$

In Equation (3), $s_g$ is the quantum well surface area. Since Auger recombination coefficient decreases exponentially with temperature, its contribution to the non-radiative lifetime at a temperature of T=4.5 K is negligible. The surface recombination lifetime at a temperature of 4.5 K can be inferred from the measured light-light data of structure B (see, e.g., FIGS. 3 and 4), with, for example, an inner core radius of $R_{core}$=100 nm, and gain medium ring with the thickness of Δ=100 nm, by fitting the slight roll-off from the linear behavior at very low pump powers. The obtained non-radiative lifetime of ~2 μsec indicates that the shape of the light-light curve at a temperature of 4.5 K depends mainly on distribution of the spontaneous emission among the cavity modes and the free-space, quantified by the β-factor. This parameter is calculated according to Equation (4) as the ratio of the spontaneous emission into the lasing mode at frequency $\omega_0$ to all spontaneous emission:

$$\beta = \frac{\Gamma_0 \int e_{(n,\omega)} L_{(\omega-\omega_i)} d\omega}{\sum_i \Gamma_i \int e_{(n,\omega)} L_{(\omega-\omega_i)} d\omega + \tau_r^{-1}} \quad (4)$$

Figure 5:
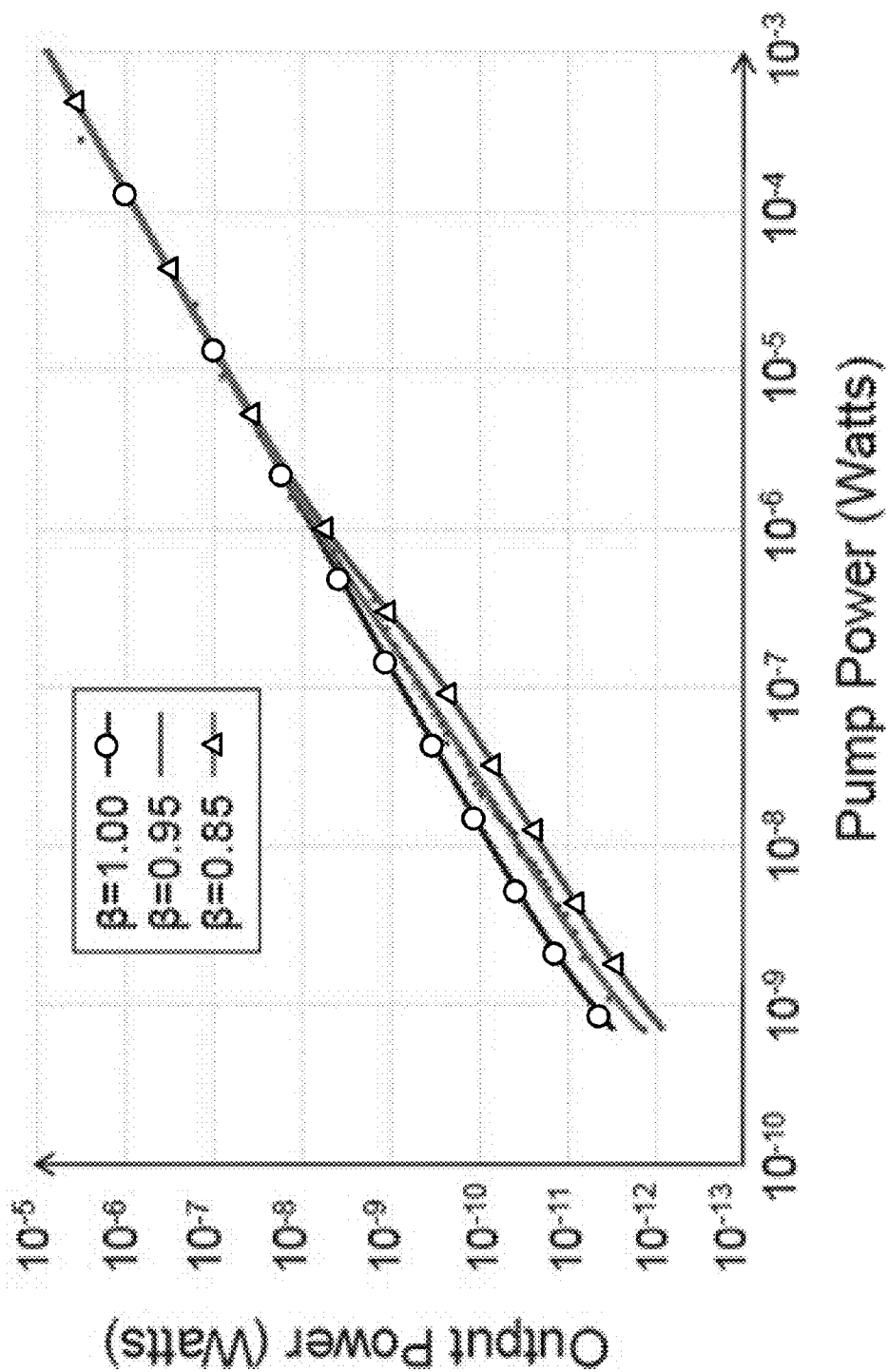
FIG. 5 shows plots of output power versus pump power for the exemplary structure shown in FIG. 1(c) operating at a temperature of 4.5 K for different values for 0.

FIG. 5 presents light-light plots for the measured data and the simulation curves for structure B of FIG. 1(c) at a temperature of 4.5 K. The plots in FIG. 5 correspond to the nano cavity structure with an inner core radius of $R_{core}$=100 nm, and gain medium ring with the thickness of Δ=100 nm for three different β-factors: 1 (top curve with open circles which is the ideal thresholdless laser), 0.95 (solid middle curve which is the best fit to data-data is represented by small closed circles), and 0.86 (bottom curve with triangles). The value of β is slightly dependent on carrier density, and the provided values were calculated at the carrier density of n=2.1023 m$^{-3}$. The simulation parameters were: $\omega_0$=1.38 μm, Q=285, Γ=0.40.

As noted in connection with FIG. 3(a), the measured light-light data for structure A, with an inner core radius of $R_{core}$=175 nm, and gain medium ring with the thickness of Δ=75 nm at a temperature of 4.5 K, exhibits a visible "kink" that defines the ASE region whose shape is determined mostly by mode competition, i.e. the distribution of spontaneous emission among the cavity modes. The rate-equations model parameters that resulted in the best fit to the measured data are: $\omega_0$=1.35 μm, $Q_0$=158, $\Gamma_0$=0.5, $\omega_{1,2}$=1.38 μm, $Q_{1,2}$=85, and $\Gamma_{1,2}$=0.45 (degenerate modes). β-factor calculation shows that, for structure A at T=4.5 K, approximately 20% of the spontaneous emission couples into the lasing mode (β=0.2).

Figure 6:
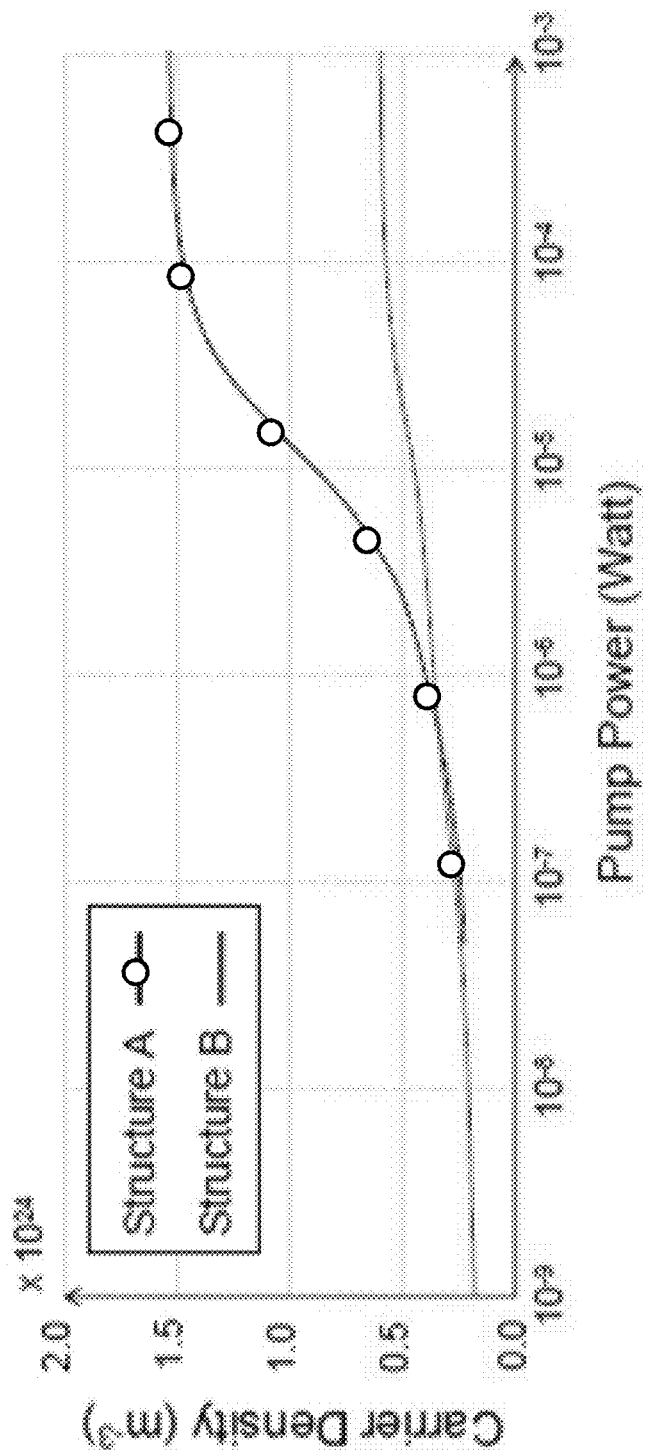
FIG. 6 shows plots of carrier density versus pump power for the exemplary structures shown in FIGS. 1(b) and 1(c) operating at a temperature of 4.5 K.

The rate-equation model also yields carrier densities, as shown in FIG. 6, corresponding to the simulated light-light curves of Structures A and B at a temperature of 4.5 K. The carrier pinning at high pump powers indicates operation in the lasing regime. Since the cryostat introduces both attenuation and defocusing, the pump rate used in the rate equation was scaled to best fit the overlap between the simulated curve and the experimental data.

At the room temperature, the high Auger recombination coefficient and high carrier density (the simulated carrier density at lasing is pinned at n=1.51·10$^{24}$m$^{-3}$) results in a fast, non-radiative recombination lifetime that determines the shape of the light-light curve. The value of Auger recombination coefficient that provides the best fit to the experimental data was C=9.8·10$^{-40}$ m$^6$/s, which is slightly higher than coefficients for InGaAsP given in the literature in part due to possible non-uniform distribution of carriers in the quantum wells. The surface recombination contribution to the non-radiative lifetime is on the order of nanoseconds, and is negligible compared to Auger contribution. Other parameters used in simulation are: $\omega_0$=1.48 μm, $Q_0$=125, $\Gamma_0$=0.49, $\omega_{1,2}$=1.52 μm, $Q_{1,2}$=75, and $\Gamma_{1,2}$=0.45 (degenerate modes).

Figure 7:
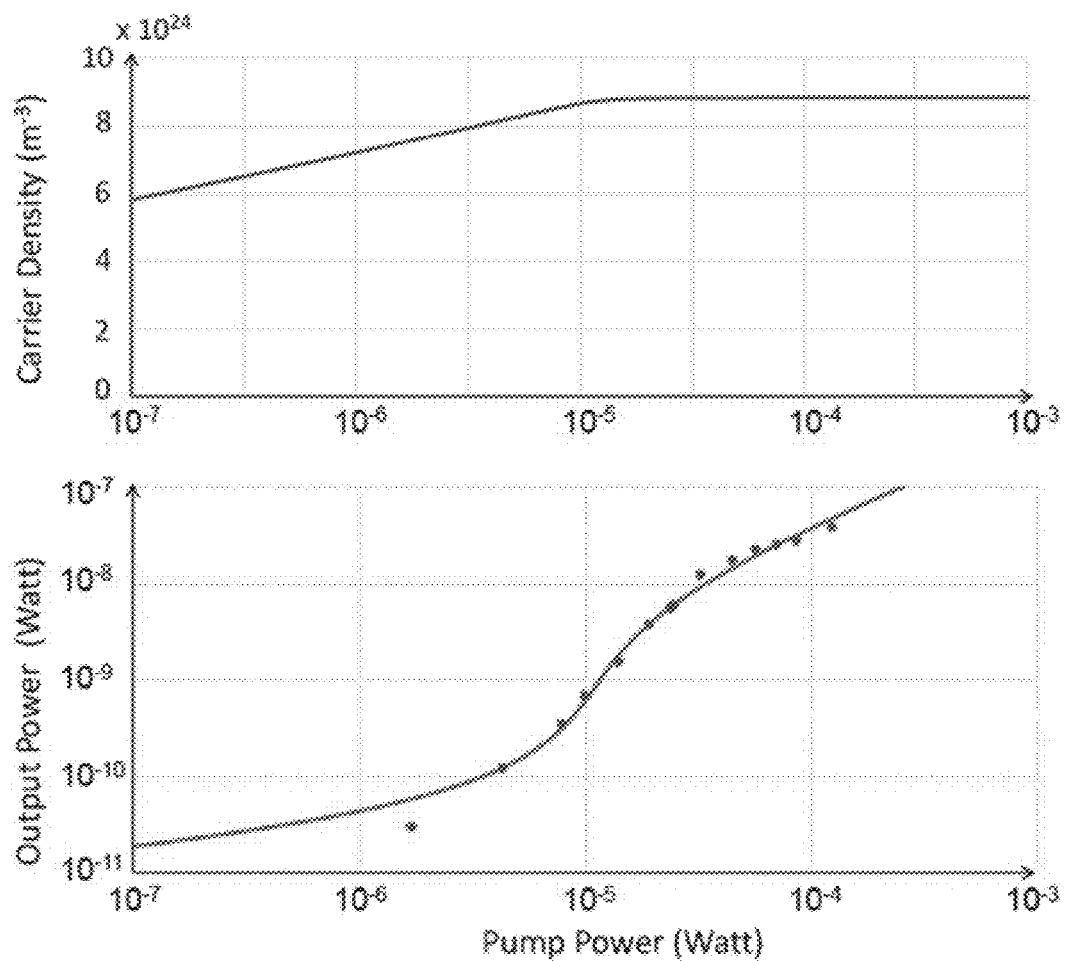
FIG. 7 shows plots of carrier density and output power versus pump power for the exemplary structure shown in FIG. 1(b) operating at room temperature.

FIG. 7 presents the carrier density, as well as the light-light curve for the laser based on structure A operating at room temperature.

At the room temperature, structure B supports more than one mode, and thus no longer fully satisfies the conditions for thresholdless lasing. In general, excess non-radiative recombination processes, especially the higher surface and Auger recombination rates, make distinguishing and characterizing thresholdless lasing behavior at room temperature a more difficult task. The reported pump power is defined as the portion of the pump power that projects on the aperture of the laser, and the reported output power is defined as the portion of the lasers' output power that is collected by the objective lens. With these definitions of the pump and output power, a lower bound for the slope efficiency is estimated to be 2% for both lasers operating at 4.5 K, and 0.02% for the laser operating at room temperature. Since the metal loss is believed to be 100 times larger at room temperature than at 4.5 K, the drop of efficiency seems reasonable. The modest numerical aperture of the objective lens allows a limited portion of the output power to be collected. The estimate of the slope efficiency would be considerably higher if the output power is defined as the total output power of the laser. For example, a measure for the total output power can be the output power at the aperture of the laser; this definition would lead to around 20 times larger efficiency estimate.

While this document contains many specifics, these should not be construed as limitations on the scope of any invention or of what may be claimed, but rather as descriptions of features that may be specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and appendices should not be understood as requiring such separation in all embodiments.

Only a few implementations and examples are described and other implementations, enhancements and variations can be made based on what is described and illustrated in this patent document.

What is claimed is:

1. A laser based on a coaxial cavity, comprising:
   a metal housing including a central metal core and a hollow metal ring surrounding the central metal core, and a laser gain medium filled in a region surrounding the central metal core within the hollow metal ring to absorb pump light and produce an optical gain at a laser wavelength, the metal housing including an open terminal and a closed terminal, the open terminal configured to receive pump light for optically pumping the laser gain medium and for outputting laser light generated by the laser gain medium, the closed terminal including a metal cap that encloses the central metal core and one side of the hollow ring, wherein the hollow ring has a diameter less than 500 nm;

a first low index material with a refractive index lower than a refractive index of the laser gain medium, the first low index material filled in the hollow ring between the metal cap and the laser gain medium to form a first interface with the laser gain medium; and a second low index material with a refractive index lower than the refractive index of the laser gain medium, the second low index material filled in the hollow ring between open terminal and the laser gain medium to form a second interface with the laser gain medium.

2. The laser of claim 1, wherein the laser gain medium, the metal housing and the first low index material are dimensioned to produce the output laser light with only a single optical mode.

3. The laser of claim 1, wherein the laser gain medium is a broadband gain medium.

4. The laser of claim 1, wherein the laser gain medium has a gain bandwidth that approximately spans 1.26 microns to 1.59 microns.

5. The laser of claim 1, the laser gain medium comprises a series of quantum well structures.

6. The laser of claim 5, wherein the laser gain medium include six quantum wells of $Inx=0.56Ga1-xAsy=0.938P1-y/Inx=0.734Ga1-xAsy=0.57P1-y$.

7. The laser of claim 6, wherein the laser gain medium further comprises an overlayer of InP.

8. The laser of claim 1, wherein the first low index material comprises silicon dioxide dimensioned to reduce or eliminate formation of plasmonic modes at the first interface.

9. The laser of claim 1, wherein the second low index material is air.

10. The laser claim 1, wherein a dimension of the second low index material along the direction of the pump light is selected to be smaller than a dimension of the first low index material along the direction of the pump light.

11. The laser of claim 1, wherein one or more surfaces of the metal housing operate as a heat sink to facilitate cooling of the laser.

12. The laser of claim 1, configured to operate as a single mode laser at room temperature.

13. The laser of claim 1, configured to achieve a spontaneous emission coupling factor, $\beta$, between 0.95 and 0.99.

14. The laser of claim 1, configured to produce a quality factor, Q, of at least 264.

15. The laser of claim 1, wherein the metal housing comprises silver.

16. An optical communication device comprising the laser of claim 1.

17. An optical sensor device comprising the laser of claim 1.

18. A method for producing laser light by operating a laser based on a coaxial cavity, the laser comprising a metal housing including a central metal core and a hollow metal ring surrounding the central metal core, and a laser gain medium filled in a region surrounding the central metal core within the hollow metal ring to absorb pump light and produce an optical gain at a laser wavelength, the metal housing including an open terminal and a closed terminal, the open terminal configured to receive pump light for optically pumping the laser gain medium and for outputting laser light generated by the laser gain medium, the closed terminal including a metal cap that encloses the central metal core and one side of the hollow ring; the laser further comprising a first low index material with a refractive index lower than a refractive index of the laser gain medium, the first low index material filled in the hollow ring between the metal cap and the laser gain medium to form a first interface with the laser gain medium; and a second low index material with a refractive index lower than the refractive index of the laser gain medium, the second low index material filled in the hollow ring between open terminal and the laser gain medium to form a second interface with the laser gain medium, the method comprising:

directing pump light into the laser gain medium within the coaxial cavity via the open terminal; and coupling laser light produced in the coaxial laser cavity from the open terminal as a laser output.

19. The method of claim 18, comprising:

using the central metal core, the metal cap and the hollow metal ring to dissipate heat generated by the coaxial laser cavity.

20. A coaxial laser cavity structure for producing laser light, comprising:

a central metal core and a hollow metal ring surrounding the central metal core to collectively form a metal housing with an open terminal and a closed terminal, the closed terminal including a metal cap that encloses the central metal core and one side of the hollow metal ring, wherein the hollow ring has a diameter less than 500 nm;

a gain section structured as a ring and located inside the housing within the hollow ring, the gain section including a laser gain medium in contact with both the hollow metal ring and the central metal core and operable to produce an optical gain for producing laser light;

a first plug section structured as a ring and located within the metal housing between the metal cap and the gain section, the first plug section including a first plug material that is different from the laser gain medium; and a second plug section structured as a ring and located within the metal housing between the gain section and the open terminal, the second plug section including a second plug material that is different from the laser gain medium.

21. The coaxial laser cavity structure of claim 20, wherein: the laser gain medium includes semiconductor quantum well layers.

22. The coaxial laser cavity structure of claim 20, wherein: the first plug material and the second plug material have refractive indices less than a refractive index of the laser gain medium.

23. The coaxial laser cavity structure of claim 20, wherein: the central metal core, the hollow metal ring surrounding the central metal core, the first and second plug sections, the gain section, the metal cap and the open and closed terminals form a coaxial laser cavity structure having a dimension less than an optical wavelength of the laser light.

24. A laser based on a coaxial laser cavity, comprising:

a metal housing including a central metal core and a hollow ring surrounding the central metal core, the metal housing including a closed terminal having a metal cap and a second open terminal, wherein the hollow ring has a diameter less than 500 nm;

a laser gain medium filled in the hollow ring inside the metal housing that absorbs optical pump light and to produce an optical gain at a laser wavelength;

a first low index material with a refractive index lower than a refractive index of the laser gain medium, the first low index material filled in the hollow ring between the metal cap and the laser gain medium to form an interface with the laser gain medium as a first cavity mirror; and a second low index material with a refractive index lower than the refractive index of the laser gain medium, the second low index material filled in the hollow ring between open terminal and the laser gain medium to form an interface with the laser gain medium as a second cavity mirror for receiving pump light for optically pumping the laser gain medium and for outputting laser light generated by the laser gain medium under the optical pump, wherein the central metal core, the hollow ring surrounding the central metal core, the laser gain medium filled in the hollow ring inside the metal housing between the first and second low index materials form a coaxial laser cavity of a dimension less than an optical wavelength the generated laser light.

25. The laser of claim 24, wherein the coaxial laser cavity is configured to support a single optical mode for the generated laser light.

26. A laser based on a coaxial cavity, comprising:
a metal housing including a central metal core and a hollow metal ring surrounding the central metal core, and a laser gain medium filled in a region surrounding the central metal core within the hollow metal ring to absorb pump light and produce an optical gain at a laser wavelength, the metal housing including an open terminal and a closed terminal, the open terminal configured to receive pump light for optically pumping the laser gain medium and for outputting laser light generated by the laser gain medium, the closed terminal including a metal cap that encloses the central metal core and one side of the hollow ring, wherein the laser gain medium has a gain bandwidth that approximately spans 1.26 microns to 1.59 microns;
a first low index material with a refractive index lower than a refractive index of the laser gain medium, the first low index material filled in the hollow ring between the metal cap and the laser gain medium to form a first interface with the laser gain medium; and
a second low index material with a refractive index lower than the refractive index of the laser gain medium, the second low index material filled in the hollow ring between open terminal and the laser gain medium to form a second interface with the laser gain medium.

27. A laser based on a coaxial cavity, comprising:
a metal housing including a central metal core and a hollow metal ring surrounding the central metal core, and a laser gain medium filled in a region surrounding the central metal core within the hollow metal ring to absorb pump light and produce an optical gain at a laser wavelength, the metal housing including an open terminal and a closed terminal, the open terminal configured to receive pump light for optically pumping the laser gain medium and for outputting laser light generated by the laser gain medium, the closed terminal including a metal cap that encloses the central metal core and one side of the hollow ring;
a first low index material with a refractive index lower than a refractive index of the laser gain medium, the first low index material filled in the hollow ring between the metal cap and the laser gain medium to form a first interface with the laser gain medium; and
a second low index material with a refractive index lower than the refractive index of the laser gain medium, the second low index material filled in the hollow ring between open terminal and the laser gain medium to form a second interface with the laser gain medium, wherein the second low index material is air.

28. A laser based on a coaxial cavity, comprising:
a metal housing including a central metal core and a hollow metal ring surrounding the central metal core, and a laser gain medium filled in a region surrounding the central metal core within the hollow metal ring to absorb pump light and produce an optical gain at a laser wavelength, the metal housing including an open terminal and a closed terminal, the open terminal configured to receive pump light for optically pumping the laser gain medium and for outputting laser light generated by the laser gain medium, the closed terminal including a metal cap that encloses the central metal core and one side of the hollow ring;
a first low index material with a refractive index lower than a refractive index of the laser gain medium, the first low index material filled in the hollow ring between the metal cap and the laser gain medium to form a first interface with the laser gain medium; and
a second low index material with a refractive index lower than the refractive index of the laser gain medium, the second low index material filled in the hollow ring between open terminal and the laser gain medium to form a second interface with the laser gain medium, wherein a dimension of the second low index material along the direction of the pump light is selected to be smaller than a dimension of the first low index material along the direction of the pump light.

29. A coaxial laser cavity structure for producing laser light, comprising:
a central metal core and a hollow metal ring surrounding the central metal core to collectively form a metal housing with an open terminal and a closed terminal, the closed terminal including a metal cap that encloses the central metal core and one side of the hollow metal ring;
a gain section structured as a ring and located inside the housing within the hollow ring, the gain section including a laser gain medium in contact with both the hollow metal ring and the central metal core and operable to produce an optical gain for producing laser light, wherein the laser gain medium has a gain bandwidth that approximately spans 1.26 microns to 1.59 microns;
a first plug section structured as a ring and located within the metal housing between the metal cap and the gain section, the first plug section including a first plug material that is different from the laser gain medium; and
a second plug section structured as a ring and located within the metal housing between the gain section and the open terminal, the second plug section including a second plug material that is different from the laser gain medium.

30. A laser based on a coaxial laser cavity, comprising:
a metal housing including a central metal core and a hollow ring surrounding the central metal core, the metal housing including a closed terminal having a metal cap and a second open terminal;
a laser gain medium filled in the hollow ring inside the metal housing that absorbs optical pump light and to produce an optical gain at a laser wavelength;
a first low index material with a refractive index lower than a refractive index of the laser gain medium, the first low index material filled in the hollow ring between the metal cap and the laser gain medium to form an interface with the laser gain medium as a first cavity mirror; and
a second low index material with a refractive index lower than the refractive index of the laser gain medium, the second low index material filled in the hollow ring between open terminal and the laser gain medium to form an interface with the laser gain medium as a second cavity mirror for receiving pump light for optically pumping the laser gain medium and for outputting laser light generated by the laser gain medium under the optical pump, wherein the central metal core, the hollow ring surrounding the central metal core, the laser gain medium filled in the hollow ring inside the metal housing between the first and second low index materials form a coaxial laser cavity of a dimension less than an optical wavelength the generated laser light and wherein the first low index material comprises silicon dioxide dimensioned to reduce or eliminate formation of plasmonic modes at the first interface.

* * * * *